United States Patent
Ulian et al.

(10) Patent No.: US 6,400,241 B1
(45) Date of Patent: Jun. 4, 2002

(54) MICROWAVE CIRCUIT MODULE AND A DEVICE FOR CONNECTING IT TO ANOTHER MODULE

(75) Inventors: Patrice Ulian, Latrape; Sébastian George, Fonsegrives; Philippe Monfraix, Toulouse, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/492,297

(22) Filed: Jan. 27, 2000

(30) Foreign Application Priority Data

Jan. 28, 1999 (FR) .............................. 99 00936

(51) Int. Cl.[7] .................................. H01P 3/10
(52) U.S. Cl. ........................ 333/246; 333/33; 333/34
(58) Field of Search .................. 333/246, 260, 333/34, 333

(56) References Cited

U.S. PATENT DOCUMENTS

| | | | | |
|---|---|---|---|---|
| 4,426,631 A | * | 1/1984 | D'Avello et al. | ............ 333/202 |
| 4,906,953 A | * | 3/1990 | Li et al. | ........................ 333/33 |
| 5,561,405 A | * | 10/1996 | Hoffmeister et al. | .......... 333/34 |
| 5,668,509 A | | 9/1997 | Hoffmeister et al. | .......... 333/33 |

FOREIGN PATENT DOCUMENTS

| | | | |
|---|---|---|---|
| EP | 0 474 393 A2 | 3/1992 | ............. H01P/1/04 |
| WO | WO 98/27793 | 6/1998 | ............. H05K/1/02 |

* cited by examiner

*Primary Examiner*—Robert Pascal
*Assistant Examiner*—Dean Takaoka
(74) *Attorney, Agent, or Firm*—Sughrue Mion, PLLC

(57) ABSTRACT

The invention relates to a microwave module having an outer face with a connection device. In the module the connection device presents, on the outer face, a central conductive zone and a peripheral conductive zone, and inside the volume of the module, connective zone, and inside the volume of the module, connection to the device takes place by means of coplanar conductors comprising a central signal conductor connected to the central conductive zone, and lateral ground conductors connected to the peripheral conductive zone. The connection is favorable to miniaturization and is suitable for operating over a broad band.

13 Claims, 2 Drawing Sheets

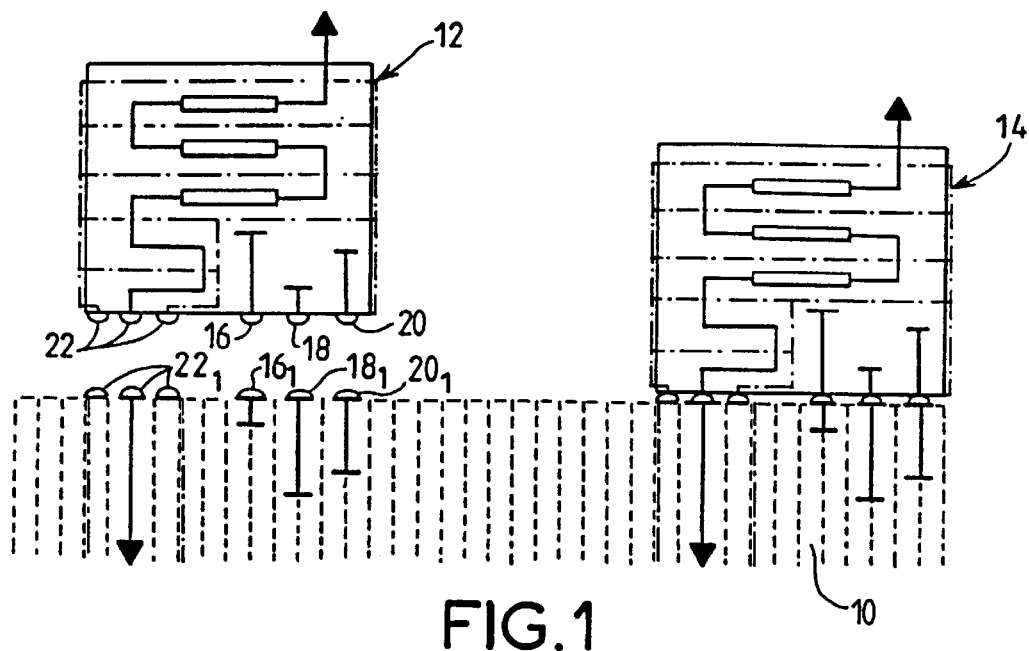
FIG. 1
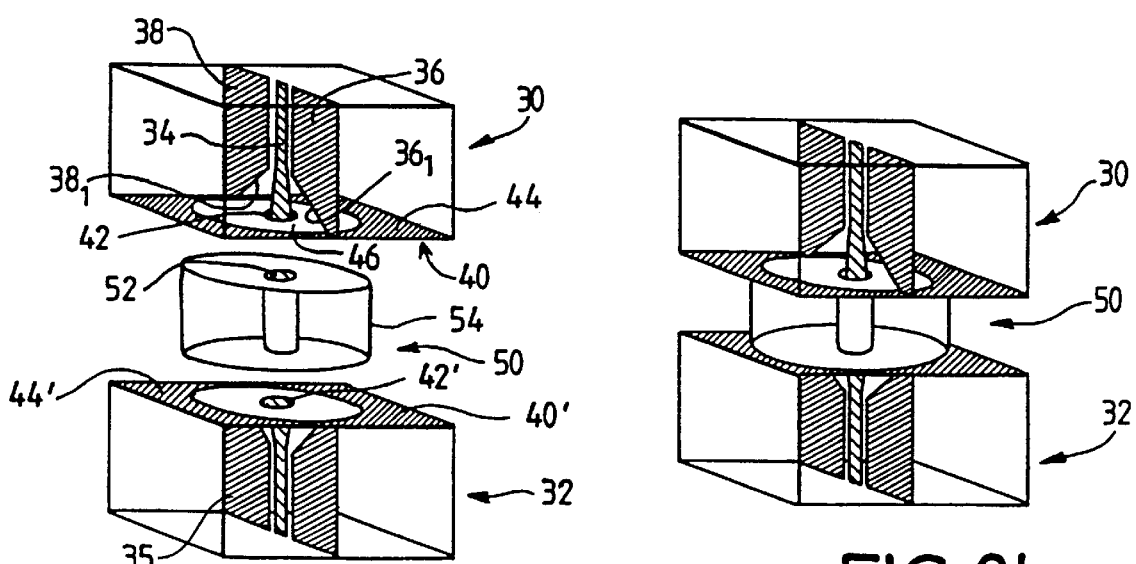
FIG. 2a
FIG. 2b

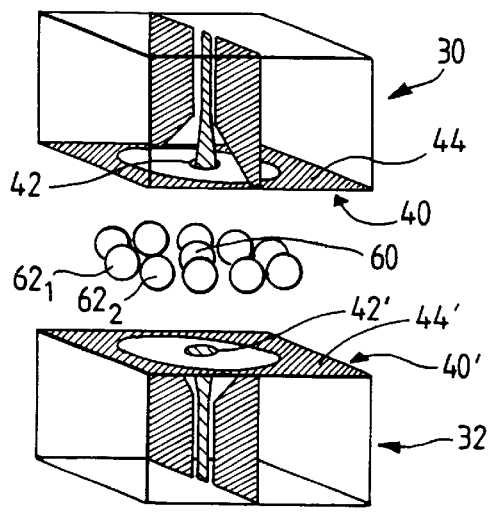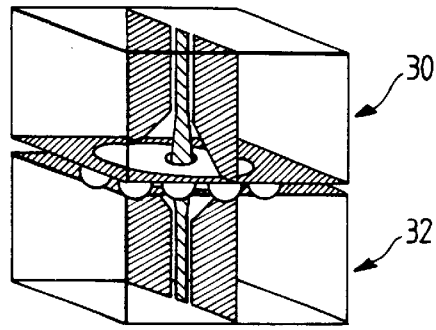
FIG.3a FIG.3b
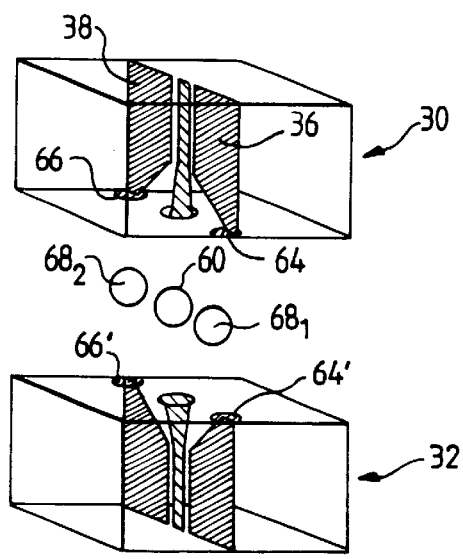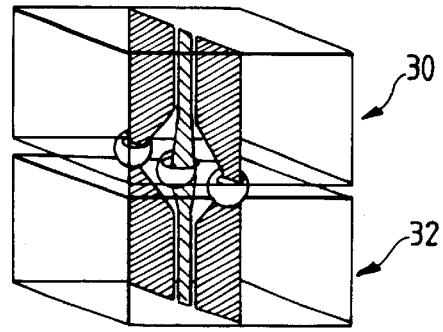
FIG.4a FIG.4b

MICROWAVE CIRCUIT MODULE AND A DEVICE FOR CONNECTING IT TO ANOTHER MODULE

The invention relates to a microwave module and to a connection device therefor.

BACKGROUND OF THE INVENTION

Microwave circuits are commonly used for various applications, and in particular in telecommunications.

These circuits can be used in particular for consumer applications and for space applications, and it is desirable to miniaturize them. To reduce the size of these circuits, use is made of integration technology whereby a set of circuits is associated in a plurality of layers thus forming an assembly which can be molded, for example.

Thus, a microwave circuit module is often in the form of a solid parallelepiped or cube.

As a general rule, such modules need to be connected together so as to transmit signals from one module to another or so as to interchange signals between modules.

For example, an active antenna comprises firstly a microwave module constituting a beam-forming network, and secondly radiating elements, each of which is associated with a microwave module. Thus, each module associated with a radiating element must be connected to the beam-forming module.

The various known connection techniques do not in general make it possible to comply with two important requirements, namely the ability to operate at any frequency (i.e. over a wide frequency band), and maximum compactness. The most usual solution for operation over a very wide band is to use coaxial connectors. However, such connectors occupy space within the module and outside the module that is difficult to make compatible with the desired miniaturization.

SUMMARY OF THE INVENTION

The module of the invention includes at least one connection device in the form of conductive zones, such as metallization zones, on an outer face, including a central zone and a peripheral zone, and inside the volume of the module, connection to said conductive zones is implemented by means of coplanar conductors comprising a central signal conductor and lateral ground conductors.

Thus, the invention combines "coplanar" connection technology inside the microwave module with coaxial type technology on its outlet face. Since a coplanar line and the coaxial type conductive zones on the outlet face interconnect in continuous manner, there is no resulting disturbance in the electromagnetic field, so the passband is not reduced.

In a preferred embodiment, the coplanar lines inside the module are substantially perpendicular to the outlet face.

It should be observed that inside the module, beyond the access, i.e. beyond the connection with the conductive zones, the connections can be of any kind. In other words, propagation inside the module can rely on any type of microwave propagation technology, such as stripline, microstrip, waveguide, etc.. Naturally, it is also possible to use coplanar connections.

On the outlet face, the conductive zones can be constituted by three separate conductive zones, i.e. a central zone and two end zones in alignment with the central zone.

The peripheral zone can also be constituted by an annular zone forming a closed line.

Two analogous modules can be interconnected by means of a coaxial or coaxial type connection. In its simplest embodiment, the central metallization of one module is connected by solder to the central metallization of the other module, and likewise the peripheral metallizations are soldered together.

The invention provides a microwave module which as an outer face with a connection device comprising a central conductive zone and a peripheral conductive zone. Inside the volume of the module, the connection to the device is provided by means of coplanar conductors comprising firstly a central signal conductor connected to the central conductive zone and secondly lateral ground conductors connected to the peripheral conductive zone.

In an embodiment, in the vicinity of their connections to the conductive zones, the coplanar conductors are substantially perpendicular to the outer face.

In an embodiment, the peripheral conductive zone of the outer face has the shape of a closed strip or line, e.g. a shape that is substantially circular. In a variant, the peripheral conductive zone has two conductive elements that are in alignment with the conductive elements of the central zone.

In an embodiment, the width of the central conductor where it connects with the central conductive zone is equal to the width it has inside the module. It is also possible to provide for the plane central conductor to have a width where it connects with the central conductive zone which is different from the width it presents inside the module.

The distance between the central conductive zone and the peripheral conductive zone can be equal to or different from the distance between the lateral conductors of the central coplanar conductor.

In an embodiment, the conductive zones are constituted by metallization, e.g., suitable for soldering.

The invention also provides a set of two microwave modules which are connected together by means of a coaxial type member having a central portion connecting together the central conductive zones of the connection devices, and an outer conductive cylinder connecting together the peripheral conductive zones of the connection devices of the two modules.

The invention also provides an assembly of two microwave modules in which the conductive zones are constituted by metallizations suitable for soldering, the two modules being interconnected by means of points of solder extending between the central conductive zones of the two associated faces, and also between the peripheral conductive zones of the connection devices of each module.

For example, a set of solder points can be provided forming a ring for interconnecting the peripheral zones. In a variant, to connect the peripheral zones together, two solder points are provided in alignment with the solder points interconnecting the central zones.

BRIEF DESCRIPTION OF THE DRAWINGS

Other characteristics and advantages of the invention will appear on reading the following description of various embodiment, given with reference to the accompanying drawings, in which:

FIG. 1 is a diagram showing a set of microwave modules of the invention;

FIG. 2a is a diagrammatic perspective view of a portion of two modules of the invention together with an assembly element, the parts being shown prior to assembly;

FIG. 2b is a view analogous to that of FIG. 2a, showing the two modules after they have been assembled together;

FIGS. 3a and 3b are two views analogous to FIGS. 2a and 2b respectively, but for another embodiment; and FIGS. 4a and 4b are likewise two views analogous to those of FIGS. 2a and 2b, but for yet another embodiment.

MORE DETAILED DESCRIPTION

In FIG. 1, modules 10, 12, and 14 of an active antenna are shown diagrammatically. Each of the modules is of the three-dimensional (3D) type and is formed, for example, by a stack of substrates each of which includes a plurality of integrated circuits (not shown), and the entire assembly is potted. Thus, each of the modules is in the form of a rectangular parallelepiped or of a cube. Connections take place via at least one face 40 of each module.

In this example, the module 10 is a beam-forming network which is designed to excite radiating elements (not shown) each of which is associated with a respective module 12, 14, etc. Each module serves to provide a power supply and microwave processing function for the radiating elements.

By way of example, each of the modules 12 and 14 comprises an attenuator, a phase shifter, a power amplifier or a low noise amplifier. The module 12 is shown prior to being assembled to the module 10, while the module 14 is shown assembled thereto.

The invention provides means for connecting the modules 12, 14, etc. . . . to the module 10, said means not degrading the microwave bandwidth that is to be transmitted and received, and also presenting maximum compactness.

The module 12 has inlets 16, 18, and 20 for DC bias voltages and a microwave inlet/outlet 22 of the pseudo-coaxial type of the invention.

The module 10 has power supply outlets $16_1$, $18_1$, and $20_1$ for connection to the inlets 16, 18, and 20 of the module 12. It also has an inlet/outlet $22_1$ for connection to the inlet/outlet 22 of the module 12.

As can be seen in the module 14, in this example connection takes place merely via points of solder.

Thus, one of the faces of the module 14 is very close to one of the faces of the module 10. The connection is miniaturized.

In the embodiments described below with reference to FIGS. 2a, 2b, 3a, 3b, 4a, and 4b, only those zones of the modules for connection which are located close to the connections (or accesses) proper are shown.

In each of these embodiments, the signal propagates inside the modules 30, 32 in the vicinity of the accesses using "coplanar" conductors. The signal is carried by a plane line 34 which is surrounded in the same plane by lateral coplanar conductors 36 and 38 which in the present example are wider and which constitute ground lines. In the vicinity of the connection, the lateral coplanar conductors 35, 36 and 38 are perpendicular to the outer face 40. For connection purposes, the outer face has areas of metallization or indentations to form a conductive central zone 42 and a ring-shaped peripheral zone 44 that is separated from the central zone by an insulating zone 46.

The central zone 42 is connected to the end of the signal conductor 34 while the lateral coplanar conductors 36 and 38 are connected to the peripheral zone 34.

For the purpose of making connections to the central zone 42 and to the peripheral zone 44, the signal conductor 34 and the lateral coplanar conductors 36 and 38 can be shaped close to the face 40 so as to match the coplanar conductors 34, 36, and 38 geometrically with the pattern 42 and 44. This geometrical matching is not difficult and can be performed by the person skilled in the art. It depends in particular on the materials chosen and on the intended application.

In the example, the conductor 34 close to the face 40 is wider than over the remainder of its length. Still in the example, at a distance from the face 40, the gaps between the central conductor 34 and the lateral coplanar conductors 36 and 38 are narrow, of widths smaller than the "width" of the ring 46. The term "width" of the ring 46 is used to mean the difference between the radius of the central zone 42 and the radius of the peripheral zone 44. The lateral coplanar conductors 36 and 38 are chamfered respectively at $36_1$ and $38_1$, said chamfers facing the signal conductor 34.

To connect the areas of metallization of the module 30 to the areas of metallization of the module 32, in the example shown in FIGS. 2a and 2b, a coaxial type assembly member 50 is provided that comprises a central conductor 52 interconnecting the central zones 42 and 42', and an outer cylindrical conductor 54 interconnecting the peripheral zones 44 and 44'.

The length of the assembly device 50 perpendicularly to the faces 40 and 40' can be minimized.

There are no disturbances to signal propagation between the two modules since propagation is practically uniform, a coaxial element being equivalent to a coplanar element.

It can also be observed that a coaxial element is obtained by winding a coplanar element around the longitudinal axis of the conductor 34.

The embodiment shown in FIGS. 3a and 3b differs from that shown in FIGS. 2a and 2b by the fact that instead of having a coaxial element 50, solder points are used. A central solder point 60 interconnects the central conductive zones 42 and 42' of the faces 40 and 40', while a ring of solder points $62_1$, $62_2$, etc. . . . interconnects the conductive rings 44 and 44'.

In the example shown in FIGS. 4a and 4b, instead of providing a continuous annular peripheral zone 44, two conductive zones 64 and 66 are provided instead, which zones are respectively interconnected with the lateral conductive strips 36 and 38. Connection takes place via three solder points, a point 60 for interconnecting the central zones, and two other points $68_1$ and $68_2$ for interconnecting the zones 64 & 64' and 66 & 66'. This embodiment has the advantage of reducing size in the plane of the face 40.

In a variant, instead of providing areas of metallization on the outside face of the face 40, metallic elements are inserted therein that are flush with said outer face and that form the central and peripheral conductive zones thereof.

What is claimed is:

1. A microwave module having an outer face with a connection device, wherein the connection device presents, on the outer face, a central conductive zone and a peripheral conductive zone, and wherein, inside the volume of the module, connection to the device takes place by means of flattened coplanar conductors comprising a flattened central signal conductor connected to the central conductive zone, and flattened lateral ground conductors connected to the peripheral conductive zone.

2. A module according to claim 1, wherein, in the vicinity of their connections with the conductive zones, the coplanar conductors are substantially perpendicular to the outer face.

3. An assembly of two microwave modules, wherein each module is in accordance with claim 1, the two modules being interconnected via a coaxial type member comprising a central portion interconnecting the central conductive zones of the connection devices, and an outer conductive cylinder interconnecting the peripheral conductive zones of the connection devices of the two modules.

4. A module according to claim 1, wherein the central signal conductor widens as it approaches the outer face of a module, and the lateral ground conductors are chamfered facing the central signal conductor.

5. A module according to claim 1, wherein the peripheral conductive zones presents two conductive elements in alignment with the conductive element of the central zone.

6. A module according to claim 1, wherein the peripheral conductive zone of the outer face separated from the central conductive zone by an insulating zone is in the form of a closed shape.

7. A module according to claim 6, wherein the closed shape is substantially circular.

8. A module according to claim 1, wherein the conductive zones are constituted by areas of metallization.

9. A module according to claim 8, wherein the areas of metallizations are suitable for soldering.

10. An assembly of two microwave modules, wherein each module is in accordance with claim 9, the two modules being interconnected by means of solder points firstly between the conductive central zones of the two associated faces and secondly between the peripheral conductive zones of the connection devices of the two modules.

11. An assembly according to claim 10, wherein, to interconnect the peripheral zones, the assembly includes two solder points in alignment with the solder points interconnecting the central zones.

12. An assembly according to claim 10, including a set of solder points forming a ring for interconnecting the peripheral zones.

13. A module according to claim 1, wherein the flattened central conductor and flattened lateral ground conductors are all in an identical plane.

* * * * *